United States Patent
Aden et al.

(10) Patent No.: US 9,698,793 B1
(45) Date of Patent: Jul. 4, 2017

(54) LIVE SYSTEM UPGRADE

(71) Applicant: Arista Networks, Inc., Santa Clara, CA (US)

(72) Inventors: Charles Melvin Aden, Santa Clara, CA (US); Xiaoping Han, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 15/143,521

(22) Filed: Apr. 30, 2016

(51) Int. Cl.
| | |
|---|---|
| *H03K 19/17* | (2006.01) |
| *G06F 12/02* | (2006.01) |
| *H03K 19/177* | (2006.01) |
| *H04L 12/24* | (2006.01) |
| *G11C 19/00* | (2006.01) |

(52) U.S. Cl.
CPC ... *H03K 19/17756* (2013.01); *G06F 12/0246* (2013.01); *G11C 19/00* (2013.01); *H03K 19/17752* (2013.01); *H04L 41/08* (2013.01); *G06F 2212/7208* (2013.01)

(58) Field of Classification Search
CPC .... G06F 8/67; G06F 9/44505; G06F 12/0246; H03K 19/17748; H03K 19/17756; H03K 19/17752; H04L 41/08; H04L 41/0873; G11C 19/00
See application file for complete search history.

(56) References Cited

U.S. PATENT DOCUMENTS

| | | | | |
|---|---|---|---|---|
| 7,555,751 B1* | 6/2009 | Abbavaram | ............. | G06F 8/67 717/168 |
| 8,780,811 B1* | 7/2014 | Datta | ................. | H04L 41/0659 370/310.2 |
| 2016/0004546 A1* | 1/2016 | Phillips | ................. | G06F 15/177 713/1 |
| 2016/0217835 A1* | 7/2016 | Blott | .................... | G11C 7/1057 |

* cited by examiner

*Primary Examiner* — Vibol Tan
(74) *Attorney, Agent, or Firm* — Womble Carlyle Sandridge & Rice LLP

(57) ABSTRACT

A method for upgrading a programmable logic device (PLD) in a network element is provided. The method includes writing PLD configuration data to a nonvolatile memory and directing a signal control device external to the PLD to hold system control signals in the network element at a predefined state irrespective of direction by the PLD. The method includes loading the PLD configuration data from the nonvolatile memory into a PLD configuration memory in the PLD, while the signal control device holds the system control signals at the predefined values. The method includes directing the signal control device to release the holding the system control signals, so that the PLD directs the system control signals, responsive to completion of the loading the PLD configuration data into the PLD configuration memory. A network element is also provided.

17 Claims, 4 Drawing Sheets

LIVE SYSTEM UPGRADE

BACKGROUND

Network elements such as switches and routers are expected to operate continuously for long periods of time. In-service software updates (ISSU) are important in the industry. Usually, these involve rebooting a network element, thereby taking it out of service during a maintenance window, or with a loss of redundancy. With clever software coding, in-service software updates can be performed without taking a network element out of service. Hardware upgrades, however, require physical removal of equipment and replacement of hardware with attendant down time. Even with programmable logic parts, such as FPGAs (field programmable gate array) and CPLDs (complex programmable logic device), it is common practice to take a network element out of service, upgrade the programmable parts, and then restore the network element to service. One problem is that customers often run their data centers around the clock, and getting a suitable maintenance window is not practical. In redundant systems, one component may be taken off-line, but then the system suffers from a loss-of-redundancy hazard which may not be acceptable. It is within this context that the embodiments arise.

SUMMARY

In some embodiments, a method for upgrading a programmable logic device (PLD) in a network element is provided. The method includes writing PLD configuration data to a nonvolatile memory and directing a signal control device external to the PLD to hold system control signals in the network element at a predefined state irrespective of direction by the PLD. The method includes loading the PLD configuration data from the nonvolatile memory into a PLD configuration memory in the PLD, while the signal control device holds the system control signals at the predefined values. The method includes directing the signal control device to release the holding the system control signals, so that the PLD directs the system control signals, responsive to completion of the loading the PLD configuration data into the PLD configuration memory.

In some embodiments, a network element is provided. The network element includes a PLD (programmable logic device) having a configuration memory, a nonvolatile memory, one or more circuits controlled at least in part by system control signals to handle network traffic, and a signal control device, external to the PLD. The network element includes a processor or state machine, configured to write PLD configuration data to the nonvolatile memory. The processor or state machine directs the signal control device to hold the system control signals at a predefined state, load the PLD configuration data from the nonvolatile memory into the configuration memory while the signal control device holds the system control signals at the predefined state, and, responsive to completion of the loading of the configuration memory, direct the signal control device so that operation of the system control signals is in accordance with direction by the PLD.

In some embodiments, a tangible, non-transitory, computer-readable media having instructions thereupon which, when executed by a processor in a network element, cause the processor to perform a method. The method includes writing PLD (programmable logic device) configuration data to a nonvolatile memory in the network element, so that a PLD in the network element can be reconfigured and directing a signal control device that is internal to the network element, external to the PLD, and coupled to system control signals, to hold the system control signals at a predefined state. The method includes loading the PLD configuration data from the nonvolatile memory into a configuration memory while the signal control device holds the system control signals at the predefined state, and directing the signal control device to cease holding the system control signals at the predefined state and allow the system control signals to be operated by the PLD, responsive to completion of the loading into the configuration memory.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A network element, such as a switch, that performs a live system upgrade to an FPGA (field programmable gate array) or other programmable logic device (PLD), uses a signal control device so that the network element continues to operate and does not need to be taken off-line. During operation when not performing a live system upgrade, the FPGA acts as a system control device and operates the signal control device, so as to produce system control signals, which are used by other circuitry in the network element. Various embodiments of the system control device are disclosed herein, and are generalizable to further electronic devices that have FPGAs and PLDs.

In one embodiment, in an Ethernet switch, control plane programmable devices make critical reset and control signals for devices that handle the data packet stream. These devices include one or more ASIC (application-specific integrated circuit) devices and optical modules. Various embodiments of the system control device hold the state of critical signals while a programmable device, e.g. an FPGA or other PLD, is reconfigured. Software, for example operating in a processor which could be in an ASIC, programs the system control device to match the active conditions. Finally, the critical signals are returned back to the control of the programmable device.

During the live system upgrade time, data packets continue to flow normally through the Ethernet switch. However, management packets directed towards the switch itself may be queued or lost during the update time, to the extent that the programmable logic being updated is needed to convey or process them, so it may be critical in some embodiments to complete the update before management protocols timeout and cause trouble. Slow operations are done in the background during normal system operation, for example writing the nonvolatile configuration memory of the programmable device, which meanwhile continues to run using configuration memory of the programmable device. The period of time where management packets are affected is minimized to just the time that the programmable device needs to reprogram itself. With the signal control device, I/O (input/output) states can be captured or driven to predefined levels in various ways.

Figure 1:
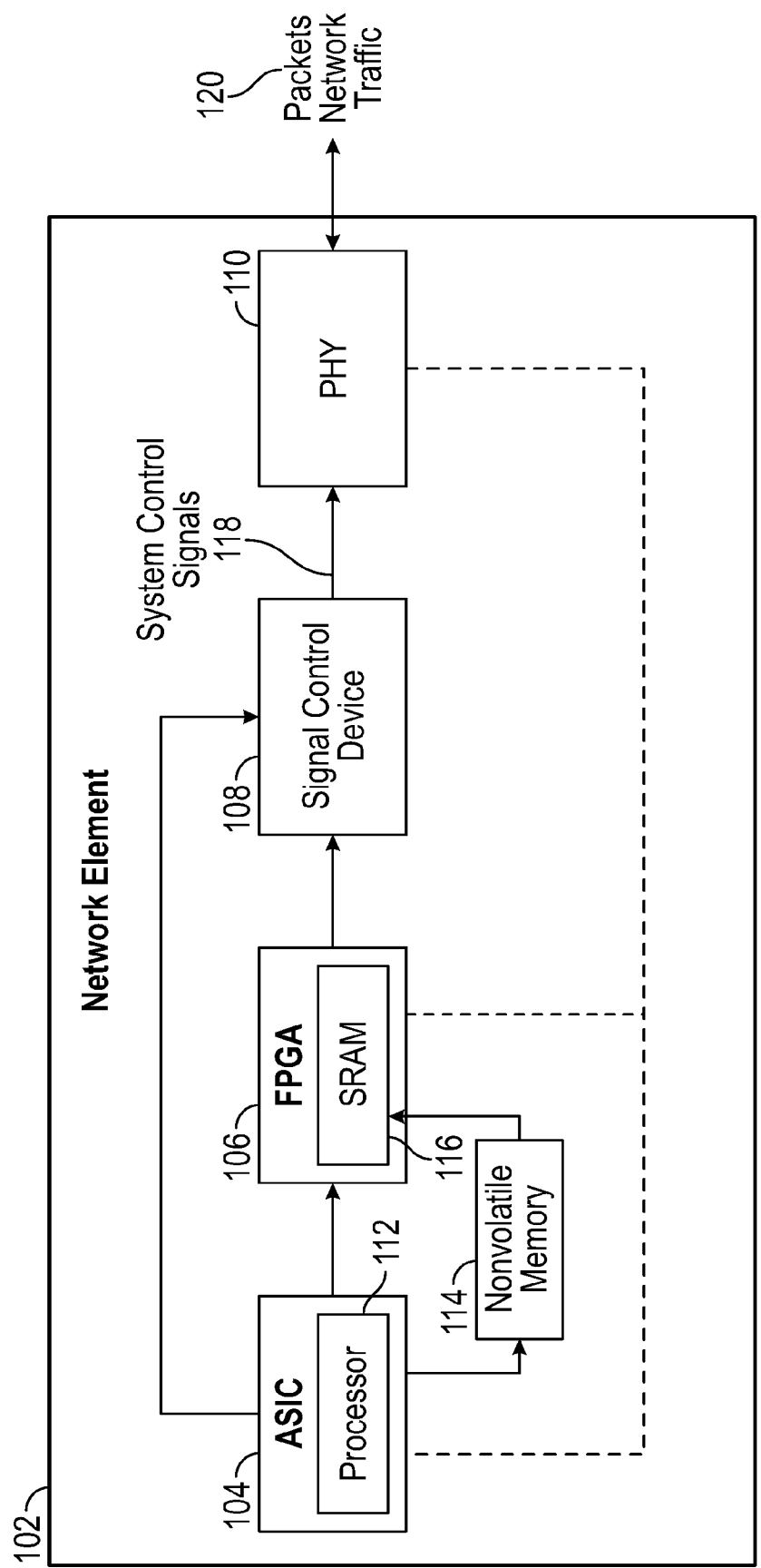
FIG. 1 is a block diagram of a network element performing a live system upgrade to the FPGA (field programmable gate array), in accordance with an embodiment of the present disclosure.

FIG. 1 is a block diagram of a network element 102 performing a live system upgrade to the FPGA 106 in accordance with an embodiment of the present disclosure. As mentioned above, the embodiments are not limited to a FPGA, as the embodiments may be extended to any PLD. The FPGA 106 has a configuration memory 116, internal to the FPGA 106. This configuration memory 116, which sets or determines the configuration of the FPGA 106 and attendant operation and operating features, could be a static random access memory (SRAM). The configuration memory 116 of the FPGA 106 is loaded from a nonvolatile memory 114, for example an electrically erasable programmable read-only memory (EEPROM), which could be external to or internal to the FPGA 106, in various embodiments. In the network element 102, an ASIC 104 is coupled to the nonvolatile memory 114, the FPGA 106, and the signal control device 108. The signal control device 108 is further coupled to the FPGA, and to a phy 110, which has the physical layer circuitry for the network element 102, including the physical ports that handle the packets or network traffic 120. The signal control device 102 is operated by the FPGA 106 during normal operation, and by a processor 112 or state machine of the ASIC 104 during the live system upgrade to the FPGA. Dashed lines show further internal connections for the packets and network traffic 120, which are not further described herein. Although described in the context of the network element 102 and control of the phy 110, the signal control device 108 is generalizable to various electronic devices in which an FPGA 106 is directing system control signals to control various circuits and could make use of a live system upgrade. For example, in place of or in addition to the ASIC 104, a CPLD (complex programmable logic device) or other integrated circuit(s) could be used in the network element 102, or other electronic device. Also, in some embodiments, the signal control device 108 is inside of either a PLD or the ASIC 104. In some embodiments the nonvolatile memory 114 is inside a PLD (e.g., a Lattice™ X02).

Figure 2:
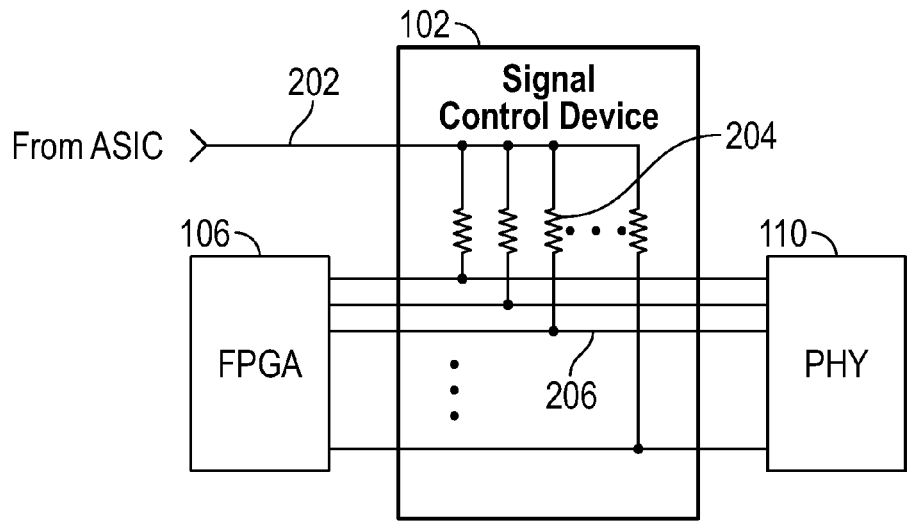
FIG. 2 depicts an embodiment of the signal control device of FIG. 1, which uses resistors and a signal from the ASIC (application-specific integrated circuit) to produce a predetermined state on system control signals.

FIG. 2 depicts an embodiment of the signal control device 108 of FIG. 1, which uses resistors 204 and a signal 202 from the ASIC 104 to produce a predetermined state on system control signals 118, including signal line 206. Signal line 206, or any of the other system control signals 118, could be a reset signal for one of the parts of the phy 110 or the ASIC 104. For example, the phy 110 could have multiple resets, and the ASIC 104 could have multiple resets.

In one embodiment, at power up when the FPGA 106 is not yet programmed, it is required that these reset signals are asserted true (e.g., active low) until the FPGA 106 is configured, so pulldown resistors would be required on the reset signal lines. During live upgrade when the phy 110 and the ASIC 104 are passing network traffic, it is required that these reset signals be false (e.g., inactive, high) when the FPGA 106 has output or I/O pins at a high impedance state during reconfiguration, so pull-up resistors would be required on the reset signal lines. The signal control device 102 uses the signal 202 from the ASIC 104, driving the resistors 204, to produce these conditions. For example, one of the programmable I/O signals from the ASIC 104 could drive or be pulled low at power up, and be programmed to drive high during live updates. The signal could be buffered or level translated, and drive the resistors to accomplish the required pulldown state during power on, and the required pull-up state during live updates. These techniques, or variations thereof, could be used for the signal 202 at one end of the resistors 204, so that the required states on the system control signals are produced by the signal control device 102 during reset, and during live system update for the FPGA 106. In variations, multiple signals 202 from the ASIC are used to independently drive groups of resistors 204, so that differing signal lines 206 can be provided appropriate states during reset and during live system update for the FPGA 106 (see also the embodiment in FIG. 5).

Figure 3:
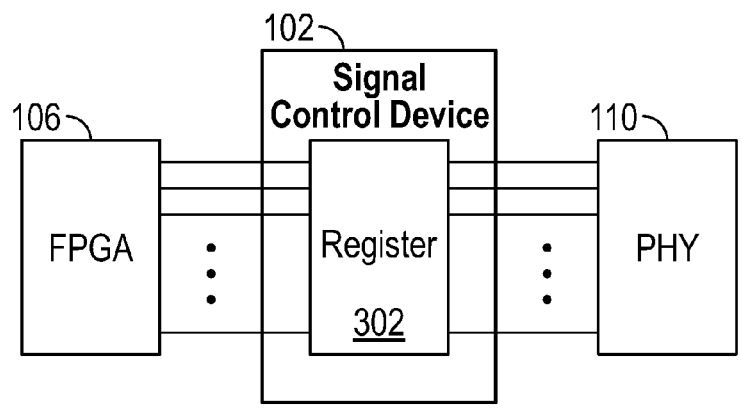
FIG. 3 depicts an embodiment of the signal control device of FIG. 1, which uses a register to hold data from the FPGA and produce the system control signals.

FIG. 3 depicts an embodiment of the signal control device 108 of FIG. 1, which uses a register 302 to hold data from the FPGA 106 and produce the system control signals 118. The register 302 is a parallel input, parallel output register, which opens to receive new data in parallel and closes to retain the data. The register 302 could be implemented using level control latches, edge control latches, master slave latches, write through latches, a FIFO (first-in first-out) register, or other memory device that can hold data from the FPGA 106 and output data onto the system control signals 118 under control of the FPGA 106 and the ASIC 104.

In one embodiment, the critical signals for the system control signals 118 include multiple reset signals and other control signals. These are routed from the FPGA 106 through an external latch serving as the register 302, using signals from the ASIC 104 operated under software executing on the processor 112. At power up, a control signal into the register 302 (see FIGS. 1 and 3) is driven false (e.g., inactive, high) so that the output of the register 302 is at high impedance state, and the control signals are pulled to their desired startup state by resistors. In a further embodiment, reset values are driven into the register 302 and presented at outputs of the register 302 during reset, so that no pull-up or pulldown resistors are needed. The control signal is then driven true (e.g., active, low) so that the latches that form the register 302 are open to follow input states. The FPGA 106 can then control the states of the system control signals 118 through the signal control device 108. To do a live system FPGA 106 upgrade, the following steps are taken, in one embodiment.

Phase 1: the upgrade FPGA image in the nonvolatile memory 114 is "background programmed" while the FPGA 106 operates undisturbed using its internal FPGA configuration memory 116 (e.g., the SRAM internal to the FPGA 106). This can be performed by the processor 112.

Phase 2: software, executing on the processor 112, closes the register 302, so that the register 302 in the signal control device 102 retains the current state of all of the system control signals 118, and these system control signals 118 no longer follow outputs of the FPGA 106.

Phase 3: while the register 302 continues to drive the system control signals 118 to the desired states, software executing on the processor 112 directs the FPGA 106 to load the FPGA configuration memory 116 from the nonvolatile memory 114. In many FPGAs, FPGA outputs float, or may be pulled high or low by resistors while the configuration is being loaded. When this is finished, the FPGA 106 drives the system control signals 118 to default states. Software executing on the processor 112 programs the FPGA registers to set outputs to match previous states of system control signals 118.

Phase 4. Software executing on the processor 112 directs control signals to the signal control device 108 to open the register 302, so that the system control signals 118 that are output from the signal control device 108 follow the outputs from the FPGA 106. Since the FPGA 106 outputs were programmed to match the previous state, the system control signals 118 from the signal control device 108 do not change at the time of switchover of control, and normal FPGA 106 control of the system control signals 118 resumes.

Figure 4:
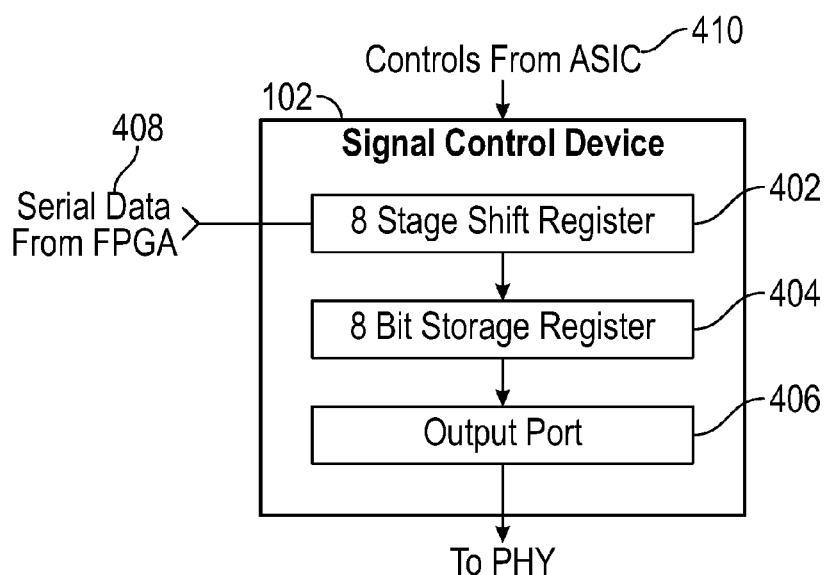
FIG. 4 depicts an embodiment of the signal control device of FIG. 1, which uses a shift register to shift in serial data from the FPGA, which is then loaded into a storage register to produce the system control signals at an output port.

FIG. 4 depicts an embodiment of the signal control device of FIG. 1, which uses a shift register 402 to shift in serial data 408 from the FPGA 106, which is then loaded into a storage register 404 to produce the system control signals 118 at an output port 406. Controls 410 from the ASIC 104, which in various embodiments are shared, exchanged with or multiplexed with controls from the FPGA 106, are input to the signal control device 102 and operate the shift register 402, the storage register 404, and the output port 406. These controls could include a serial clock, and various loads and enables. Clocked flip-flops could be used to build the shift register 402, and the storage register 404 could be built using similar circuitry to the register 302 shown in FIG. 3. The output port 406 could be directly from the storage register 404, or could include additional buffering or output controllability. Also, similar to the register 302 in FIG. 3, the storage register 404 and the output port 406 could be operated during reset and live system upgrade to the FPGA 106 so as to produce desired states on the system control signals 118. The main difference from the embodiment depicted in FIG. 3 is that, in the embodiment depicted in FIG. 4, data from the FPGA 106 is loaded into the shift register 402 in serial data form. This serial transfer of data uses a lesser number of wires, device pins and overall area (e.g. of a printed circuit board or an integrated circuit) for signal routing than does the parallel implementation of input to the register 302 in FIG. 3, and a serial device has a smaller footprint than does a parallel device because of having fewer pads, pins or port connections.

In one embodiment, at power up, the shift register 402 and the storage register 404 are cleared, for example by the processor 112 operating control signals that go into the signal control device 102. This establishes the desired values on the output port 406, which is enabled at power up. In another embodiment, the shift register is cleared, and the cleared shift register values are loaded into the storage register 404. In yet another embodiment, values in the shift register 402 and storage register 402 could be cleared, or not, and the output port is left at a high impedance state at power up. This is depicted and further described with reference to FIG. 5.

After the FPGA 106 loads its configuration, the FPGA 106 drives shift register controls and data input to fill the shift register 402 with desired initial state that matches the initial state of the output port 406 in the various embodiments. Then, the FPGA 106 asserts a load signal to transfer contents of the shift register 402 to the storage register 404, and enables the output port 406 (or leaves the output port 406 enabled if it already was, in some embodiments). To do a live system FPGA upgrade, the following steps are taken.

Phase 1: the upgrade FPGA image in the nonvolatile memory 114 is "background programmed" while the FPGA 106 operates undisturbed using its internal configuration memory 116 copy.

Phase 2: software, for example executing on the processor 112, drives one or more signals to the signal control device 108 to freeze the shift register 402 and close the storage register 404, so that the shift register and storage register 404 direct the output port 406 to retain the current state of the system control signals 118. Various forms of multiplexing or control handover could be used, with participation from the FPGA 106 and/or the ASIC 104, in various embodiments.

Phase 3: software, for example executing on the processor 112 and operating ASIC 104 outputs, directs the FPGA 106 to load the configuration memory 116 from the nonvolatile memory 114. During the load, the FPGA 106 outputs float or are pulled high or low while the configuration memory 116 is being loaded. After the FPGA configuration memory 116 is loaded, software, for example executing on a processor 112, programs the FPGA registers to set FPGA 106 outputs to match previous states.

Phase 4: software, for example executing on a processor 112, directs the FPGA to resume operating the shift chain operation for the shift register 402. The system control signals 118 did not change at that moment, because values emerging from the FPGA 106 and contents in the signal control device 108 have been set for consistency. Normal FPGA 106 control of the signal control device 106 and system control signals 108 produced by the signal control device 108 resumes.

Figure 5:
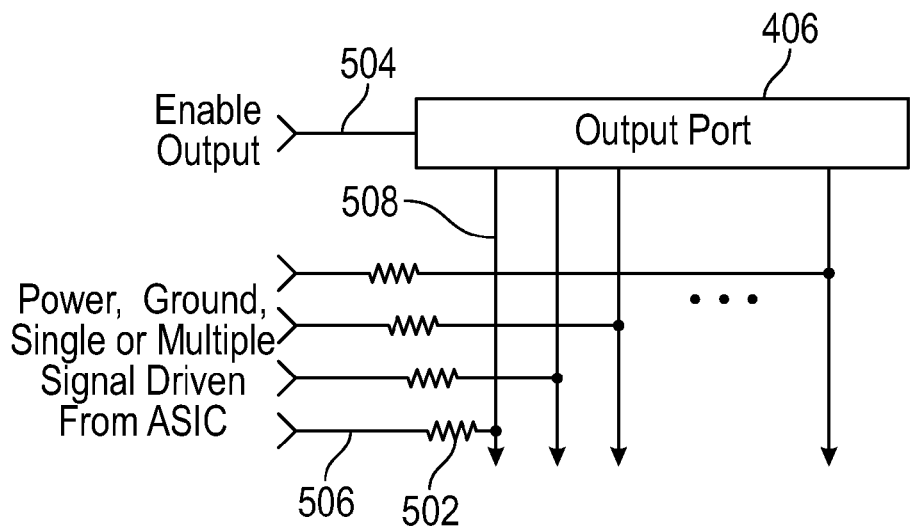
FIG. 5 depicts a variation of the output port of FIG. 4, which has resistors with power, ground or signal connection(s) to establish the system control signals on power up.

FIG. 5 depicts a variation of the output port of FIG. 4, which has resistors 502 with power, ground or signal connection(s) to establish the system control signals 118 (see FIG. 1) on power up. Each signal line 508 from the output port 406 is set to a desired value by connecting power, ground, or a signal from the ASIC 104 to a corresponding input 506 to a resistor 502. The resistor input 506 can be controlled individually, or bundled together in groups or en masse, in various embodiments. This is related to the embodiment shown in FIG. 2, and applies thereto. The enable output 504 can be controlled by the ASIC 104 and/or the FPGA 106, to put the output port 406 into a high impedance output state at power up, or a driving state after the storage register 404 is loaded. In some embodiments, a resistor to power ground brings the enable output 504 to a known value at power up.

Variations and combinations of the features described with reference to FIGS. 1-5 are readily devised for further embodiments of the signal control device 108 and operation thereof. Principles of operation should include that the system control signals 118 are brought to respective known states during power on, reset, and normal operation of the ASIC 104 and the FPGA 106, and during the live system upgrade of the FPGA 106. The nonvolatile memory 114 should be loaded, during normal operation, with the state information for uploading to the FPGA 106 configuration memory 116. The signal control device 108 should be operated, during the loading of the contents of the nonvolatile memory 114 into the configuration memory 116, by the ASIC 104 or other control or default control signals so as to have system control signals 118 consistent with FPGA 106 outputs immediately preceding and immediately following the uploading to the FPGA 106 configuration memory 116. While the FPGA 106 is loading the configuration memory 116, the signal control device 108 should hold the system control signals 118 at predefined values irrespective of direction by the FPGA 106. The signal control device 108 should be operated by the FPGA 106 during normal operation, so that the FPGA 106 directs the system control signals 118 to the phy 110 or other devices or circuitry of the network element 102. System requirements for adapting embodiments of the signal control device 108 to further electronic devices besides network elements are readily discerned, in keeping with the teachings herein.

Figure 6:
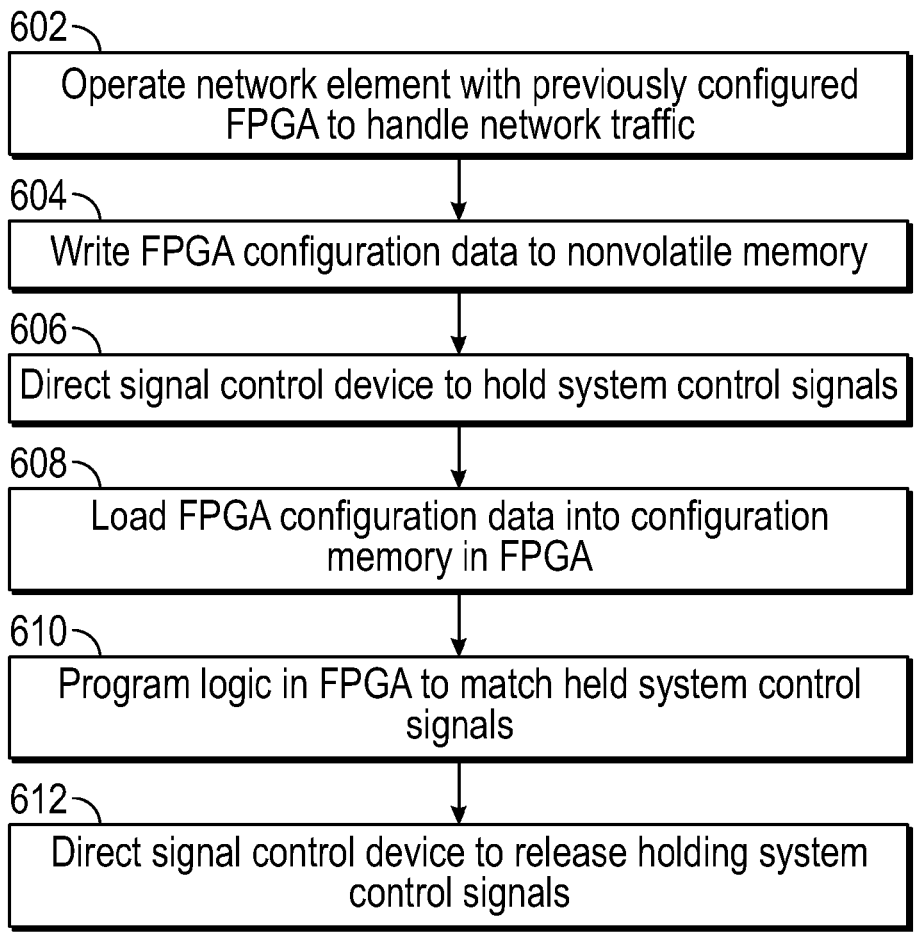
FIG. 6 is a flow diagram of a method for performing a live system upgrade in a network element.

FIG. 6 is a flow diagram of a method for performing a live system upgrade in a network element. The method can be performed using embodiments of the signal control device described with reference to FIGS. 1-5. The method can be performed by a processor, executing software, or a state machine, directing an FPGA, with both the processor and the FPGA directing the signal control device and the signal control device under such direction producing the system control signals.

In an action 602, the network is operated with the previously configured FPGA, to handle network traffic. This is the so-called normal operation of the network element. In an action 604, FPGA configuration data is written to a nonvolatile memory. The nonvolatile memory could be internal to, or external to the FPGA 106, in various embodiments, and is distinct from the configuration memory inside the FPGA. The FPGA continues to operate using the configuration in the FPGA configuration memory, while the nonvolatile memory is being loaded with the next configuration for the FPGA.

In an action 606, the signal control device is directed to hold the system control signals. Various embodiments depicted in FIGS. 1-5 show how the signal control device is operated and holds the system control signals. System control signals are held at a predetermined state, so that the devices downstream and controlled by the system control signals continue to operate normally while the live system upgrade of the FPGA continues.

In an action 608, the FPGA configuration data is loaded from the nonvolatile memory into the configuration memory in the FPGA. This upgrades the FPGA to the next state, which was loaded into the nonvolatile memory in the action 604. In an action 610, logic in the FPGA is programmed to match the system control signals held by the signal control device. This could be performed by writing to one or more registers in the FPGA, in some embodiments. In an action 612, the signal control device is directed to release holding the system control signals. The FPGA can then take over operating the signal control device so as to have the FPGA direct the system control signals. Normal operation of the network element continues, with the FPGA upgraded according to the new configuration data.

Figure 7:
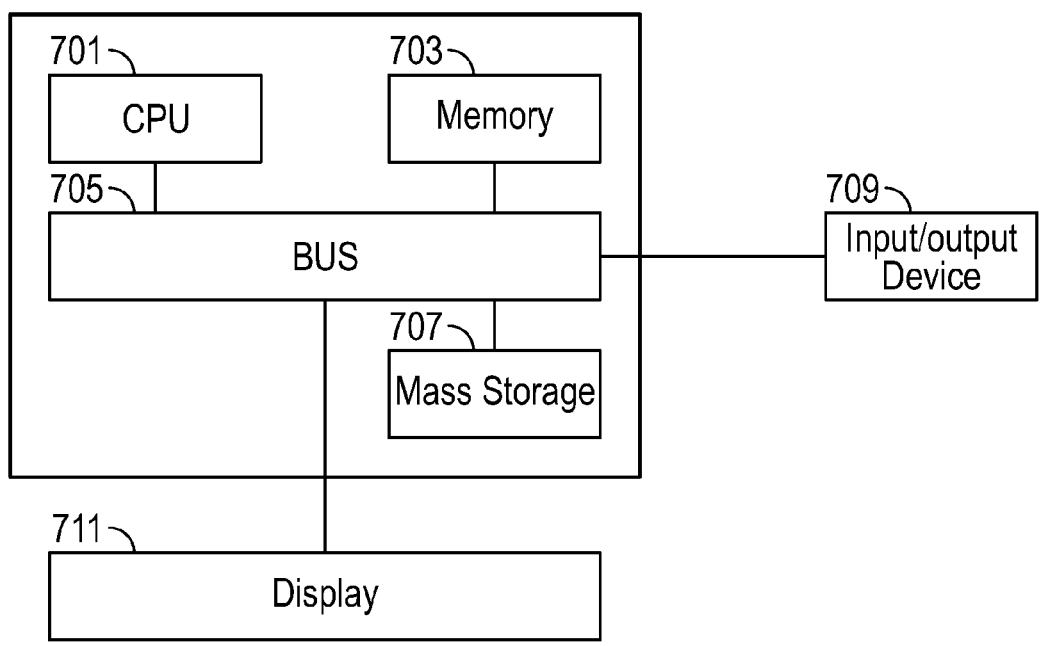
FIG. 7 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 7 is an illustration showing an exemplary computing device which may implement the embodiments described herein. The computing device of FIG. 7 may be used to perform embodiments of the functionality for a processor in a network element or other electronic device in accordance with some embodiments. The computing device includes a central processing unit (CPU) 701, which is coupled through a bus 705 to a memory 703, and mass storage device 707. Mass storage device 707 represents a persistent data storage device such as a floppy disc drive or a fixed disc drive, which may be local or remote in some embodiments. The mass storage device 707 could implement a backup storage, in some embodiments. Memory 703 may include read only memory, random access memory, etc. Applications resident on the computing device may be stored on or accessed via a computer readable medium such as memory 703 or mass storage device 707 in some embodiments. Applications may also be in the form of modulated electronic signals modulated accessed via a network modem or other network interface of the computing device. It should be appreciated that CPU 701 may be embodied in a general-purpose processor, a special purpose processor, or a specially programmed logic device in some embodiments.

Display 711 is in communication with CPU 701, memory 703, and mass storage device 707, through bus 705. Display 711 is configured to display any visualization tools or reports associated with the system described herein. Input/output device 709 is coupled to bus 705 in order to communicate information in command selections to CPU 701. It should be appreciated that data to and from external devices may be communicated through the input/output device 709. CPU 701 can be defined to execute the functionality described herein to enable the functionality described with reference to FIGS. 1-6. The code embodying this functionality may be stored within memory 703 or mass storage device 707 for execution by a processor such as CPU 701 in some embodiments. The operating system on the computing device may be MS DOS™, MS-WINDOWS™, OS/2™, UNIX™, LINUX™, or other known operating systems. It should be appreciated that the embodiments described herein may also be integrated with a virtualized computing system implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method for upgrading a programmable logic device (PLD) in a network element, comprising:
   writing PLD configuration data to a nonvolatile memory;
   directing a signal control device external to the PLD to hold system control signals in the network element at a predefined state irrespective of direction by the PLD;
   pulling to a first state, during reset, a plurality of resistors attached to system control signal lines, wherein the directing the signal control device to hold the system control signals at the predefined state comprises driving the plurality of resistors to a second state;

loading the PLD configuration data from the nonvolatile memory into a PLD configuration memory in the PLD, while the signal control device holds the system control signals at the predefined values; and directing the signal control device to release the holding the system control signals, so that the PLD directs the system control signals, responsive to completion of the loading the PLD configuration data into the PLD configuration memory.

2. The method of claim 1, wherein:

one or more circuits are controlled at least in part by the system control signals; and the one or more circuits handle network traffic while the nonvolatile memory is being written to and while the PLD configuration memory is being written to.

3. The method of claim 1, further comprising:

loading data for the predefined values from the PLD into a parallel input, parallel output register in the signal control device, wherein the directing the signal control device to hold the system control signals at the predefined state includes closing the parallel input, parallel output register with the data for the predefined values therein.

4. The method of claim 1, further comprising:

loading data for the predefined values from the PLD as serial data into a shift register in the signal control device; and loading the data for the predefined values from the shift register into a parallel input, parallel output register in the signal control device.

5. The method of claim 1, further comprising:

directing outputs of the signal control device to be high impedance, at power up, wherein the outputs of the signal control device are pulled by resistors at the power up so as to establish a first state of the system control signals.

6. The method of claim 1, further comprising:

directing a shift register of the signal control device to clear, at power up; and directing a parallel input, parallel output register of the signal control device to load contents of the cleared shift register into the parallel input, parallel output register, so as to establish a first state of the system control signals at power up.

7. A network element, comprising:

a PLD (programmable logic device) having a configuration memory therein;

a nonvolatile memory;

one or more circuits controlled at least in part by system control signals to handle network traffic;

a signal control device, external to the PLD, the signal control device comprising:

a plurality of resistors attached to output or I/O pins of the PLD and driven by at least one signal line controlled by the processor or state machine; and a processor or state machine, configured to write PLD configuration data to the nonvolatile memory, direct the signal control device to hold the system control signals at a predefined state, load the PLD configuration data from the nonvolatile memory into the configuration memory while the signal control device holds the system control signals at the predefined state, and, responsive to completion of the loading of the configuration memory, direct the signal control device so that operation of the system control signals is in accordance with direction by the PLD.

8. The network element of claim 7, wherein the predefined state is such that the one or more circuits continue to handle the network traffic while the configuration memory is being loaded.

9. The network element of claim 7, wherein the signal control device comprises:

a latch coupled to the PLD and to the one or more circuits, with an output of the latch producing the system control signals.

10. The network element of claim 7, wherein the signal control device comprises:

a shift register coupled to the PLD; and a parallel input, parallel output register having an input port coupled to the shift register and having an output port producing the system control signals and coupled to the one or more circuits.

11. The network element of claim 7, wherein the signal control device comprises:

a shift register coupled to the PLD;

a parallel input, parallel output register having an input port coupled to the shift register and having an output port coupled to the one or more circuits; and a plurality of resistors attached to the output port to establish a power up state of the system control signals.

12. The network element of claim 7, wherein the signal control device comprises:

a shift register coupled to the PLD;

a parallel input, parallel output register having an input port coupled to the shift register and having an output port coupled to the one or more circuits; and the processor or state machine further configured to operate control signals to the shift register and the parallel input, parallel output register so that the output port of the parallel input, parallel output register has the system control signals held at the predefined state while the processor or state machine is loading the PLD configuration data from the nonvolatile memory into the configuration memory.

13. A tangible, non-transitory, computer-readable media having instructions thereupon which, when executed by a processor in a network element, cause the processor to perform a method comprising:

writing PLD (programmable logic device) configuration data to a nonvolatile memory in the network element, so that a PLD in the network element can be reconfigured;

directing a signal control device that is internal to the network element, external to the PLD, and coupled to system control signals, to hold the system control signals at a predefined state, the directing the signal control device to hold the system control signals at the predefined state comprises:

driving one or more control lines, attached to a plurality of resistors that are attached to signal lines having the system control signals, to a first state, with PLD outputs or I/Os (input/outputs) in a high impedance state and attached to the signal lines;

loading the PLD configuration data from the nonvolatile memory into a configuration memory while the signal control device holds the system control signals at the predefined state; and directing the signal control device to cease holding the system control signals at the predefined state and allow the system control signals to be operated by the PLD, responsive to completion of the loading into the configuration memory.

14. The computer-readable media of claim 13, wherein the method further comprises:

programming logic in the PLD, after the loading the PLD configuration data into the configuration memory and before the directing the signal control device to cease holding the system control signals at the predefined state, so that the PLD matches the predefined state held by the signal control device.

15. The computer-readable media of claim 13, wherein the directing the signal control device to hold the system control signals at the predefined state comprises:

loading data from the PLD into a parallel input, parallel output register in the signal control device so as to produce the predefined values at an output of the parallel input, parallel output register coupled to signal lines, to produce the system control signals.

16. The computer-readable media of claim 13, wherein the directing the signal control device to hold the system control signals at the predefined state comprises:

loading serial data from the PLD into a shift register in the signal control device; and loading parallel data from the shift register into a parallel input, parallel output register in the signal control device, so as to produce the predefined values on the system control signals at an output port of the parallel input, parallel output register.

17. The computer-readable media of claim 13, wherein the method further comprises:

clearing a shift register of the signal control device, at power up; and transferring cleared contents of the shift register to a parallel input, parallel output register of the signal control device, wherein the parallel input, parallel output register drives the system control signals.

\* \* \* \* \*